(12) United States Patent
Okada

(10) Patent No.: US 6,756,768 B2
(45) Date of Patent: Jun. 29, 2004

(54) METHOD AND APPARATUS FOR COMPUTING REMAINING BATTERY CAPACITY UTILIZING BATTERY DISCHARGE CAPACITY

(75) Inventor: Tetsuya Okada, Sumoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/323,688

(22) Filed: Dec. 20, 2002

(65) Prior Publication Data

US 2003/0117143 A1 Jun. 26, 2003

(30) Foreign Application Priority Data

Dec. 26, 2001 (JP) ........................................ 2001-394602

(51) Int. Cl.[7] ........................ H01M 10/44; H01M 10/46
(52) U.S. Cl. ...................................... 320/132; 324/426
(58) Field of Search ................................ 320/132, 149; 324/426, 428, 430, 431, 433

(56) References Cited

U.S. PATENT DOCUMENTS

| | | | | | |
|---|---|---|---|---|---|
| 4,678,998 | A | * | 7/1987 | Muramatsu | 324/427 |
| 5,126,675 | A | * | 6/1992 | Yang | 324/435 |
| 5,404,106 | A | * | 4/1995 | Matsuda | 324/431 |
| 5,631,540 | A | * | 5/1997 | Nguyen | 320/127 |
| 6,061,639 | A | * | 5/2000 | Wistrand | 702/63 |
| 6,107,779 | A | * | 8/2000 | Hara et al. | 320/132 |

* cited by examiner

*Primary Examiner*—Edward H. Tso
(74) *Attorney, Agent, or Firm*—Wenderoth, Lind & Ponack, L.L.P.

(57) ABSTRACT

Remaining battery capacity is computed by computing battery discharge capacity from an integrated value of a product of discharge current and voltage to find remaining battery capacity via energy (integrated power). Battery discharge capacity is computed by adding the integrated value of power consumed by internal resistance to a discharge capacity value calculated from the integrated product of discharge current and voltage, and the remaining battery capacity is computed from this battery discharge capacity.

13 Claims, 1 Drawing Sheet

METHOD AND APPARATUS FOR COMPUTING REMAINING BATTERY CAPACITY UTILIZING BATTERY DISCHARGE CAPACITY

This application is based on Application No. 394602 filed in Japan on Dec. 26, 2001, the content of which is incorporated hereinto by reference.

BACKGROUND OF THE INVENTION

This invention relates to a method of accurately computing remaining battery capacity and to a battery pack containing a circuit for that computation.

Electrical equipment which displays computed remaining battery capacity is convenient for the user. This is because the user can estimate remaining usable time while operating the electrical equipment. It is particularly important that this type of electrical equipment display remaining battery capacity as accurately as possible. If remaining capacity is displayed in error, inconvenient situations result. For example, electrical equipment may become unusable even though remaining capacity is displayed, or electrical equipment may be usable with no remaining capacity displayed.

Remaining capacity of a battery can be displayed in units of Ah (Ampere hour) by an integrated current method, or in units of Wh (Watt hour) by an integrated power or energy method. When battery voltage decreases in the Ah remaining capacity display method, it is necessary to compensate for that decrease when converting to consumed power. For example, if remaining capacity drops to 50% of full-charge capacity, remaining capacity displayed in Wh will not be 50% if battery voltage decreases. As a result, even if remaining capacity of a battery attached to electrical equipment consuming a constant amount of power is displayed as 50% in Ah, one half of the total usable time does not remain for use. This is because the amount of current to supply a constant amount of power must increase when battery voltage decreases. On the other hand, when remaining capacity is displayed as 50% of full-charge capacity by the Wh method of display, one half of the usable time remains for battery attachment to electrical equipment consuming a constant amount of power. Namely, the method of displaying remaining capacity as Wh of integrated power or energy has the characteristic that remaining usable time can be accurately inferred even if battery voltage decreases.

To compute remaining battery capacity based on integrated power or energy, discharge capacity calculated from integrated power is subtracted from the full-charge state, or integrated power discharge capacity is subtracted from charge capacity. Discharge capacity, which is integrated power or energy, is calculated by the time integral of the product of discharge current, voltage, and discharge efficiency.

Discharge capacity calculated by integrating the product of discharge current, voltage, and discharge efficiency is different from actual battery discharge capacity, and error results. Error between calculated and actual discharge capacity develops particularly easily when discharge current varies. This is because discharge efficiency varies widely with discharge current.

The present invention was developed to solve these drawbacks. Thus, it is a primary object of the present invention to provide a method of computing remaining battery capacity and a battery pack that can calculate discharge capacity more accurately and compute remaining capacity with a high degree of accuracy.

The above and further objects and features of the invention will more fully be apparent from the following detailed description with accompanying drawings.

SUMMARY OF THE INVENTION

The method of computing remaining battery capacity of the present invention calculates battery discharge capacity from the integral of the product of battery discharge current and voltage, and computes remaining capacity as integrated power or energy. The method of computing remaining capacity measures internal battery resistance, calculates battery discharge capacity by adding the value of integrated power consumed by internal battery resistance to the value of discharge capacity calculated from the integral of the product of battery discharge current and voltage, and computes remaining capacity from this discharge capacity.

The battery pack of the present invention is provided with a computation circuit 2 to calculate battery discharge capacity from the integral of the product of battery discharge current and voltage, and compute remaining capacity as integrated power or energy. The computation circuit 2 measures internal battery resistance, calculates battery discharge capacity by adding the value of integrated power consumed by internal battery resistance to the value of discharge capacity calculated from the integral of the product of battery discharge current and voltage, and computes remaining capacity from this discharge capacity.

The method of computing remaining battery capacity and the battery pack described above have the characteristic that discharge capacity can be more accurately calculated and remaining capacity can be computed with a high degree of accuracy. This is because the value of integrated power consumed by internal battery resistance is added to the discharge capacity value calculated from the integral of the product of battery discharge current and voltage to calculate battery discharge capacity. Since integrated power consumed by internal battery resistance is considered in the discharge capacity calculation, the error between actual discharge capacity and calculated discharge capacity can be drastically reduced, a more accurate discharge capacity can be calculated, and remaining battery capacity can be computed with a high degree of accuracy.

The method of computing remaining battery capacity and the battery pack of the present invention can compute remaining capacity by subtracting the value of integrated power consumed by internal battery resistance from the value of charge capacity calculated from the integral of the product of battery charging current and voltage. Since this method of computing remaining battery capacity and battery pack considers integrated power consumed by internal battery resistance for charge capacity computation as well as discharge capacity computation, it can more accurately compute remaining battery capacity.

This method of computing remaining battery capacity and the battery pack have the characteristic that not only discharge capacity, but also charge capacity can be more accurately calculated to allow remaining battery capacity to be computed with a high degree of accuracy.

Internal battery resistance can be calculated by measuring open circuit battery voltage, and charging voltage and current during battery charging. Further, internal battery resistance can also be determined by measuring discharge voltage and current during battery discharge.

The calculated value of discharge capacity can also be found from the integrated value of the product of battery discharge voltage, current, and discharge efficiency.

Similarly, the calculated value of charge capacity can also be found from the integrated value of the product of battery charging voltage, current, and charging efficiency.

DETAILED DESCRIPTION OF THE INVENTION

Figure 1:
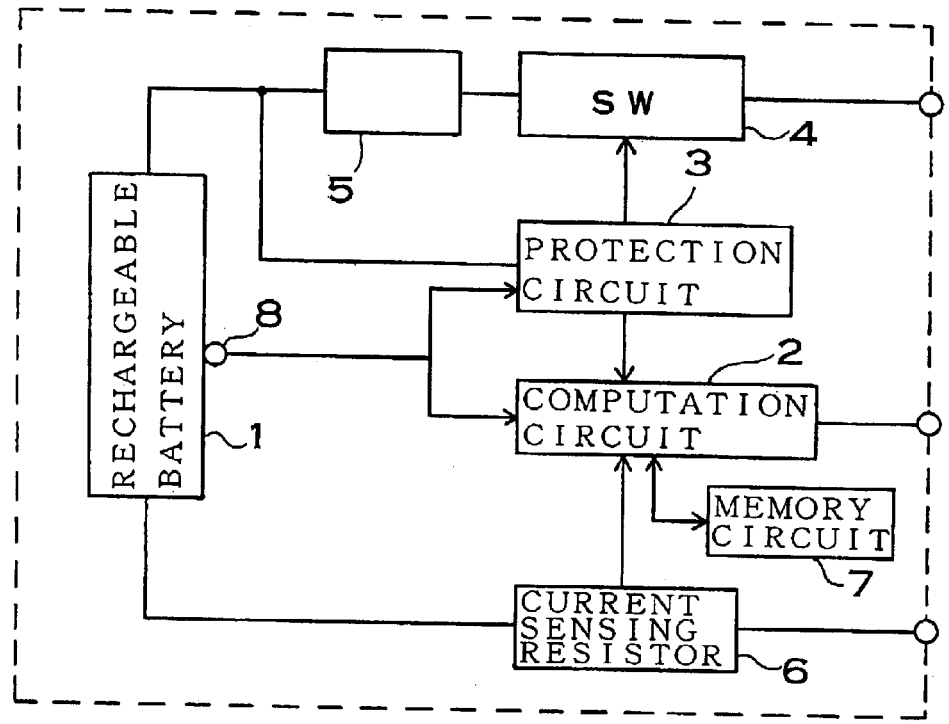
FIG. 1 is a block diagram of a battery pack for an embodiment of the present invention.

The battery pack shown in FIG. 1 is provided with a rechargeable battery 1, a computation circuit 2 to compute a remaining capacity of the rechargeable battery 1 as integrated power or energy, a battery protection circuit 3, a switching device 4 controlled by the protection circuit 3, a temperature fuse 5 connected in series with the switching device 4, and a current sensing resistor 6 to measure current flowing in the battery.

The rechargeable battery 1 is a single battery or a plurality of rechargeable batteries 1 connected in series or parallel. The rechargeable battery 1 is any battery which can be recharged, such as a lithium ion rechargeable battery, nickel hydrogen battery, or nickel cadmium battery.

The computation circuit 2 computes remaining battery capacity as integrated power or energy (Wh). Remaining capacity is computed by subtracting discharge capacity from the full-charge state, or by subtracting discharge capacity from charge capacity. The full-charge capacity is the specified capacity for a new battery. However, full-charge battery capacity decreases with use. Therefore, as an example, the computation circuit 2 counts battery charge-discharge cycles and corrects the full-charge capacity. On the other hand, the integrated charge capacity from a completely discharged state is used to correct the full-charge capacity. The completely discharged state is determined by battery voltage. In addition, the full-charge state is also determined by battery voltage. Full-charge for a lithium ion rechargeable battery is determined when battery voltage reaches a specified voltage. For a nickel hydrogen battery or nickel cadmium battery, full-charge is determined when battery voltage reaches a peak voltage or when voltage decreases from the peak voltage by an amount ΔV.

Figure 2:
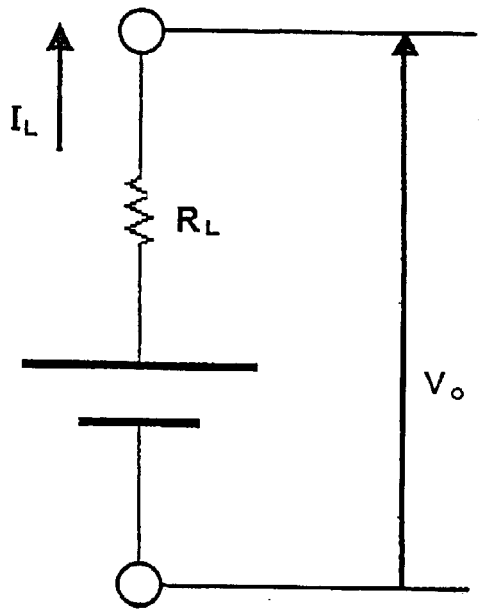
FIG. 2 is a circuit diagram showing an equivalent circuit of a battery.

FIG. 2 shows a battery equivalent circuit. As shown in this figure, the battery is connected in series with an internal resistance. In this equivalent circuit, $V_O$ is battery output voltage, $I_L$ is discharge current, and $R_L$ is internal resistance. If P is the power supplied to a load, here, power supplied to the load is given by the following equation.

$$P = V_O \times I_L$$

The integrated power or energy supplied to the load is calculated by the computation circuit 2 by integrating the product of output voltage $V_O$ and current $I_L$. However, power output from the battery is not only consumed by the load, but is also consumed by the internal battery resistance. Power consumed by internal resistance is the product of the internal resistance and the square of the current. Thus, power consumed by internal resistance is $R_L \times I_L^2$. For example, when internal resistance is 70 mΩ, average battery output voltage is 3.7V, and discharge current, $I_L$, is 2A, power, P, consumed by the load is 3.7×2=7.4 W. In this case, the internal resistance consumes 0.07×2×2=0.28 W of power. Power consumed by the internal resistance is 3.8% of the power consumed by the load. Therefore, if the computation circuit 2 performs calculations by only integrating power consumed by the load, a 3.8% error will result.

To accurately calculate discharge capacity, the computation circuit 2 adds the integrated value of power consumed by internal battery resistance to the integrated value of power consumed by the load. The integrated power or energy consumed by the load is calculated from the integral of the product of battery discharge current $I_L$ and voltage $V_O$. To calculate integrated power or energy consumed by the load with even greater accuracy, the computation circuit 2 calculates the value of discharge capacity from the integrated product of battery discharge current, voltage, and discharge efficiency. Then, the computation circuit 2 adds the integrated value of power consumed by internal battery resistance to that value of discharge capacity to determine battery discharge capacity. If η is discharge efficiency, the computation circuit 2 calculates the value of discharge capacity consumed by the load by integrating $V_O \times I_L$ η. Further, the computation circuit 2 calculates the integrated value of power consumed by internal battery resistance by integrating $R_L \times I_L^2$. The integrated value of power consumed by internal battery resistance is added to the integrated power consumed by the load to determine discharge capacity.

When discharge capacity has been accurately computed, it can be subtracted from full-charge capacity to compute remaining battery capacity. The computation circuit 2 can also compute remaining battery capacity by subtracting discharge capacity from charge capacity. In this case, the computation circuit 2 calculates charge capacity from the integrated value of the product of battery charging current and voltage. Here, all the power supplied from the battery charger to the battery is not used to charge the battery. Part of the power for battery charging is consumed by the internal resistance. Consequently when battery charge capacity is computed, the integrated value of power consumed by internal battery resistance is subtracted from the charge capacity calculated by integrating charging power. During battery charging, the integrated value of power consumed by internal battery resistance is calculated by integrating $R_L \times I_C^2$, where $I_C$ is the charging current. When VO is the voltage supplied to the battery and η is the charging efficiency, the calculated charge capacity is calculated by integrating $V_O \times I_C \times \eta$.

To calculate the integrated value of power consumed by internal battery resistance, the computation circuit 2 computes the value of the internal resistance. Open circuit voltage ($V_{OPEN}$), which is battery voltage while neither charging or discharging is performed, charging voltage ($V_O$), which is battery voltage during charging, and charging current ($I_C$) are measured. Internal resistance ($R_L$) is calculated from the following equation.

$$R_L = (V_{OPEN} - V_O)/I_C$$

Further, battery internal resistance can also be calculated by measuring open circuit voltage, and discharge voltage and current. In this case, open circuit voltage ($V_{OPEN}$) measured when the battery is not discharging, and discharge voltage ($V_O$) and discharge current ($I_L$) measured during battery discharge are used to calculate internal resistance ($R_L$) from the following equation.

$$R_L = (V_{OPEN} - V_O)/I_L$$

The computation circuit 2 can also make corrections to the calculated internal resistance considering battery degradation due to temperature or time of operation. In general, rechargeable battery 1 performance degrades with use. In particular, degradation is extreme with use in severe environments. Consequently, the computation circuit 2 can revise the value of internal battery resistance based on parameters such as operating time and temperature. The battery pack shown in FIG. 1 is provided with a memory circuit 7, and degradation coefficients based on temperature and time of operation are stored as EEPROM parameters. The computation circuit 2 revises internal resistance values based on measured temperature, time of operation, and on degradation coefficients stored in the memory circuit 7. Battery temperature is measured by a temperature sensor 8.

Charging current and discharge current are determined by measuring the voltage across the current sensing resistor 6 connected in series with the battery. Since discharge current ($I_D$) and charging current ($I_C$) are proportional to the voltage ($E_R$) developed across the terminals of the current sensing resistor ($R_S$), they are calculated from the following equations.

$$I_L = E_R/R_S, I_C = E_R/R_S$$

The battery pack shown in FIG. 1 is provided with the protection circuit 3 to protect the battery from over-charge, over-discharge, over-current, and further to prevent battery temperature from becoming excessively high. The protection circuit 3 controls the switching device 4 on and off to protect the battery 2. The protection circuit 3 turns the switching device 4 off to stop discharge if no battery capacity remains and the battery goes into a state of over-discharge. The protection circuit 3 also turns the switching device 4 off to stop charging if the battery 2 reaches full-charge. The protection circuit 3 also turns the switching device 4 off to cut-off over-current when excessive current flows. Further, the protection circuit 2 turns the switching device 4 off to cut-off current when battery temperature measured by the temperature sensor 8 rises above a pre-scribed temperature.

Finally, the battery pack 2 shown in FIG. 1 has the temperature fuse 5 connected in series with the switching device 4. If battery temperature becomes abnormally high, the temperature fuse 5 fuses open to cut-off the current.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims or equivalence of such metes and bounds thereof are therefore intended to be embraced by the claims.

What is claimed is:

1. A method of computing a remaining battery capacity, said method comprising:

obtaining one of a full-charge capacity and a charge capacity;

measuring an internal battery resistance;

computing a battery discharge capacity by adding an integrated value of power consumed by the internal battery resistance to a computed discharge capacity value calculated from an integrated product of discharge current and voltage; and computing the remaining battery capacity by subtracting the battery discharge capacity from the one of the full-charge capacity and the charge capacity.

2. A method as recited in claim 1, wherein said obtaining operation obtains the charge capacity and said obtaining operation comprises subtracting the integrated value of power consumed by the internal battery resistance from a computed charge capacity value calculated from an integrated product of battery charging current and voltage.

3. A method as recited in claim 1, wherein said measuring of the internal battery resistance comprises measuring an open circuit battery voltage, and measuring a charging voltage and current during battery charging.

4. A method as recited in claim 1, wherein said measuring of the internal battery resistance comprises measuring an open circuit battery voltage, and measuring a discharge voltage and current during battery discharge.

5. A method as recited in claim 1, wherein said computing of the battery discharge capacity comprises computing the battery discharge capacity by adding the integrated value of power consumed by the internal battery resistance to a computed discharge capacity value calculated from an integrated product of the discharge current and voltage and a discharge efficiency.

6. A method as recited in claim 2, wherein said obtaining operation comprises subtracting the integrated value of power consumed by the internal battery resistance from a computed charge capacity value calculated from an integrated product of the battery charging current voltage, and a charging efficiency.

7. A method recited in claim 1, further comprising measuring a battery time of use and temperature during battery operation, and correcting a value of the internal battery resistance according to the time, the temperature and a pre-stored degradation coefficient.

8. A battery pack comprising:

a computation circuit operable to obtain one of a full-charge capacity and a charge capacity, measure an internal battery resistance, compute a battery discharge capacity by adding an integrated value of power consumed by the internal battery resistance to a computed discharge capacity value calculated from an integrated product of discharge current and voltage, and compute a remaining battery capacity by subtracting the battery discharge capacity from the one of the full-charge capacity and the charge capacity.

9. A battery pack as recited in claim 8, wherein said computation circuit obtains the charge capacity by subtracting the integrated value of power consumed by the internal battery resistance from a computed charge capacity value calculated from an integrated product of battery charging current and voltage.

10. A battery pack as recited in claim 8, wherein said computation circuit measures the internal battery resistance by measuring an open circuit battery voltage, and measuring a charging voltage and current during battery charging.

11. A battery pack as recited in claim 8, wherein, said computation circuit measures the internal battery resistance by measuring an open circuit battery voltage, and measuring a discharge voltage and current during battery discharge.

12. A battery pack as recited in claim 8, wherein said computation circuit calculates the computed discharge capacity value from an integrated product of discharge current and voltage, and a discharge efficiency.

13. A battery pack as recited in claim 9, wherein said computation circuit calculates the computed charge capacity value from an integrated product of charging current and voltage, and a charging efficiency.

* * * * *